United States Patent
Agashe et al.

(10) Patent No.: US 7,134,061 B2
(45) Date of Patent: Nov. 7, 2006

(54) AT-SPEED ATPG TESTING AND APPARATUS FOR SOC DESIGNS HAVING MULTIPLE CLOCK DOMAIN USING A VLCT TEST PLATFORM

(75) Inventors: Anupama Aniruddha Agashe, Maharashtra (IN); Nikila Krishnamoorthy, Karnataka (IN); Anindya Saha, Karnataka (IN); Rubin A. Parekhji, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 436 days.

(21) Appl. No.: 10/731,714

(22) Filed: Dec. 9, 2003

(65) Prior Publication Data

US 2005/0055615 A1 Mar. 10, 2005

Related U.S. Application Data

(60) Provisional application No. 60/501,131, filed on Sep. 8, 2003.

(51) Int. Cl.
*G01R 31/28* (2006.01)
(52) U.S. Cl. .................................................. 714/726
(58) Field of Classification Search ...................... None
See application file for complete search history.

(56) References Cited

U.S. PATENT DOCUMENTS

| | | | |
|---|---|---|---|
| 5,592,493 A * | 1/1997 | Crouch et al. ............... | 714/729 |
| 5,663,966 A | 9/1997 | Day et al. ................. | 371/22.36 |
| 6,106,568 A | 8/2000 | Beausang et al. .............. | 716/18 |
| 6,304,988 B1 | 10/2001 | Levy ........................... | 714/726 |
| 6,442,722 B1 * | 8/2002 | Nadeau-Dostie et al. ... | 714/731 |
| 6,587,981 B1 | 7/2003 | Muradali et al. ........... | 714/726 |
| 6,598,192 B1 * | 7/2003 | McLaurin et al. .......... | 714/726 |
| 6,966,021 B1 * | 11/2005 | Rajski et al. ................ | 714/726 |
| 7,007,213 B1 * | 2/2006 | Wang et al. ................. | 714/729 |
| 2004/0268181 A1* | 12/2004 | Wang et al. .................. | 714/30 |

OTHER PUBLICATIONS

"Scan-Based Transition Fault Testing—Implementation and Low Cost Test Challenges" Saxena et al., ITC International Test Conference, IEEE 2002, pp. 1120-1129.

* cited by examiner

*Primary Examiner*—Albert Decady
*Assistant Examiner*—John P. Trimmings
(74) *Attorney, Agent, or Firm*—J. Dennis Moore; W. James Brady; Frederick J. Telecky, Jr.

(57) ABSTRACT

A scan test circuitry design imbedded on an SoC having the scan architecture of a VLCT platform is disclosed herein. This BIST circuitry design that is not limited in the number of scan test ports supported includes at least one scan chain group having a corresponding clock domain that couples to receive test stimulus data. Each scan chain group has a corresponding test mode signal to shift the test stimulus data at a shift clock rate derived from its corresponding clock domain. A controlling demultiplexer connects to each multiplexer unit within each scan chain group to provide control signals for shifting in the test stimulus. A clock control mechanism provides a control signal for each scan chain to shift test stimulus and capture resultant data. Furthermore, when a simultaneous test mode signal is enabled, the clock control mechanism couples to each scan chain to enable simultaneous capture of each scan chain group.

5 Claims, 5 Drawing Sheets

AT-SPEED ATPG TESTING AND APPARATUS FOR SOC DESIGNS HAVING MULTIPLE CLOCK DOMAIN USING A VLCT TEST PLATFORM

This application claims priority under 35 USC 119(e)(1) of provisional application No. 60/501,131, filed Sep. 8, 2003.

FIELD OF THE INVENTION

The present invention relates to an at-speed Automatic Test Pattern Generator (ATPG) for testing a System on Chip (SoC), and, more particularly, to at-speed testing for SoC Designs having multiple clock domains and frequencies that implement testing using the Very Low Cost Test (VLCT) platform.

BACKGROUND OF THE INVENTION

An Automatic Test Pattern Generator (ATPG) is a software design tool that simulates the overall functionality of the design or individual circuits within the design of an integrated circuit and generates test vectors for testing the overall functionality of the design. Through the use of these at-speed test vectors, an Automatic Testing Equipment (ATE) may provide a particular degree of fault coverage or fault simulation for the circuitry in the product. Specifically, automatic test pattern generation (ATPG) techniques may provide test patterns for stuck-at faults, transition faults and path delay faults. Conventionally, these test vectors are provided in a computer readable file to the ATE or other testers. The ATE is used in a manufacturing environment to test the die at wafer sort and in packaged tests. During wafer-level testing of a die, test signals are provided through input or input/output (I/O) bond pads on the die, and the test results are monitored on output or I/O bond pads.

Testing of digital systems, such as the core logic of an integrated circuit, is typically performed by loading a test pattern or stimulus into scanable memory elements in the system, launching the test data into the system, operating the system in normal mode for one or more clock cycles of the system clock, capturing the response of the system to the test stimulus, unloading the test response from the system and then comparing the response to the response which should have been obtained if the system was operating according to design.

To improve test coverage of individual circuits, DFT tools have been developed to embed test circuitry into the SoC. For example, Built-In Self-Test (BIST) circuitry may be embedded in the IC design to test individual circuit blocks. BIST circuitry is particularly useful for testing circuit blocks that are not readily accessible through the bond pads of the device under test (DUT). Automated DFT tools that generate BIST circuitry, such as memory BIST for testing memory blocks and logic BIST for testing logic blocks, are well known. External I/Os directly receive the results of tests conducted by BIST circuitry. In the alternative, external I/Os receive these results indirectly through boundary scan circuitry embedded in the design. Additional internal embedded test circuitry such as scan chain circuitry may also be added to the design to increase the internal testability of internal sequential designs.

This separate embedded test circuitry requires input and output ports that are separate from the input and output ports of the programmed functions. During normal operations, the functional circuitry operates. In the alternative, during the testing mode of operations, a separate set of test circuitry using the test inputs and outputs are used. Each core and sub-core embedded on a SoC includes its own test input and output ports and needs to be tested individually, without interference from adjacent cores. Wrapper cell is the circuitry attached to the functional elements of a core to provide paths for test data to flow. The test ports are part of the wrapper cell. It generally includes a flip-flop and a multiplexer, and is able to function in a functional mode and a test mode. In the functional mode, the wrapper cell is transparent and normal functional signals are passed through the multiplexer to the functional core. In the test mode, the wrapper cell changes the input signal causing the test input to be passed through the multiplexer.

Scan testing is implemented by chaining several wrapper cells together in a chip register in order to scan test data in and out of the circuit. There are many different schemes for scan testing, but the predominant method is the monolithic scan path approach where the scan elements, such as the wrapper cell and scan chains are connected in a straight path, serial manner.

Scan-in ports may connect directly to scan-in terminals for each core. This makes it possible to select specific internal scan chains or subsets of internal scan chains, however, this is difficult to implement because the total number of available scan ports at the integrated circuit chip boundary typically are exceeded by the total number of scan paths requiring access to these ports.

As such, the suitability of at-speed test vectors depends upon the design of the scan architecture and clock control mechanism corresponding to the testing mode. A very low cost test platform (VLCT), having reduced speed and accuracy requirements, provides an attractive solution to this problem; yet, it has restrictions on the number of scan test ports that can be supported. Presently, the number is restricted to eight scan chains. Unfortunately, many systems having a large number of scan chains either preclude the use of VLCT or the support for at-speed ATPG pattern application using high speed capture clocks. Some solutions use sophisticated masking integrated with the flip-flops in one or more scan chains.

Moreover, difficulties arise in systems having multiple clock domains when the clock sources differ from the test clock signal used to perform the test, when these domains have different clock rates, and/or when signals cross the boundary between these clock domains have different clock frequencies. More particularly, it is not uncommon for a SoC integrated circuit (IC) to include several digital modules having a variety of clocking domains and clock frequencies. Since the elements in one domain operate at a different frequency from that of other domains in the system, special provisions must be made during testing to ensure that signals traversing clock domains are synchronized. Otherwise, the test response from the system will not be repeatable and test results will be unreliable.

Methods have been developed for testing systems in which the ratio of the frequencies of two clock domains is an integer. However, it is not uncommon for digital systems to employ asynchronous clocks whose frequencies are not multiples of each other. Solutions have yet to be developed for clock domains having non-integer frequency ratios. Testing of such systems using normal operating frequency of a digital system is difficult because the phase relationships between the system clocks are not known and are variable over time. In order to achieve very high reliability circuits, it is essential that the logic in all clock domains be tested at full-speed.

Most of these circuits have been tested using test clock rates that are essentially the same as the functional clock rates and disabling all signal paths crossing clock domain boundaries, where the tests are repeated for each clock domain. The primary drawbacks of this approach are that part of the logic is not tested and a series of tests must be performed in order to test all parts of the system. However, even then, it is not possible to obtain results for all parts of the system operating concurrently at speed.

Accordingly, there is a need for a testing method and circuitry which enables testing at the design or functional speed of digital systems having two or more clock domains where the clock domains are asynchronous clocks whose frequencies are not multiples of one another. Specifically, there is a need for a SoC design that uses the VLCT platform, having at-speed transition fault ATPG, where the constraint on the number of scan test ports is expanded beyond eight scan test ports. Testing of the SoC must be conducted across all clock domains and clock frequencies. In addition, the design implementing the use of the VLCT platform must be scaleable.

The present invention is directed to overcoming, or at least reducing the effects of one or more of the problems set forth above.

SUMMARY OF THE INVENTION

To address the above-discussed deficiencies of test circuitry imbedded on SoC system designs, the present invention teaches an integrated circuit chip having the scan architecture of a VLCT platform that is not limited in the number of scan test ports that may be supported. The integrated circuit chip includes at least one scan-in terminal, at least one scan-out terminal, at least one scan chain group, a controlling demultiplexer, a clock control mechanism, and a controlling multiplexer. Each scan chain group couples between a scan-in and scan-out terminal, where the scan-in terminal couples to receive a test stimulus input data and the scan-out terminal provides the output testing resultant data. Each scan chain group has a clock domain. A test clock signal enables the testing of each scan chain group. Moreover, each scan chain group has a corresponding test mode signal to shift the test stimulus input data at a shift clock rate derived from its corresponding clock domain. Specifically, each scan chain group includes a demultiplexer unit, a first multiplexer unit, a scan chain and a second multiplexer unit. The demultiplexer unit couples to receive the test stimulus input data and the test clock signal. The first multiplexer unit, having an enable input, connects to the demultiplexer unit in addition to having its enable input coupled to receive a simultaneous test mode signal. The scan chain has a corresponding scan chain clock domain at a predetermined frequency. It connects to the first multiplexer unit. The second multiplexer unit connects to the scan chain and couples to receive test stimulus output data to supply testing resultant data to the respective scan-out terminal. The second multiplexer unit includes an enable input coupled to receive the test clock.

The controlling demultiplexer connects to each first multiplexer unit to provide control signals for concurrently clocking in the test stimulus input data into each scan chain at the predetermined frequency. The clock control mechanism receives a scan enable signal, the test clock signal, a simultaneous test mode signal, a plurality of test mode select pin inputs, a functional clock and enable signal corresponding to each scan chain group. The clock control mechanism generates a control signal to each scan chain for the shifting of test stimulus input data and the capturing of the testing resultant data. The clock control mechanism couples to each scan chain to enable one scan chain to shift test stimulus input data when the scan enable signal and the test clock signal are enabled. Furthermore, when the scan enable, the test clock, and the simultaneous test mode signals are enabled, the clock control mechanism couples to each scan chain to enable simultaneous capture of each scan chain group. The controlling multiplexer couples to each scan chain to provide control for the second multiplexer of the least significant scan chain group.

Advantages of this design include but are not limited to an integrated circuit chip or SoC design that is VLCT compliant which impacts the overall test cost. Since the number of transition fault patterns is large, this feature provides additional savings. This design supports pure at-speed transition fault testing using scan justified or functionally justified patterns. This design lends itself well to stuck-at fault testing, where a single slow speed clock is applied. In addition, this design is scaleable across multiple scan chains and clock domains. Moreover, this apparatus and method impacts the pattern volume that is required for full testing coverage and the simplicity of test pattern generation is enhanced.

These and other features and advantages of the present invention will be understood upon consideration of the following detailed description of the invention and the accompanying drawings.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set for the herein. Rather, these embodiments are provided so that this disclosure will be thorough and complete, and will fully convey the scope of the invention to those skilled in the art.

Figure 1A:
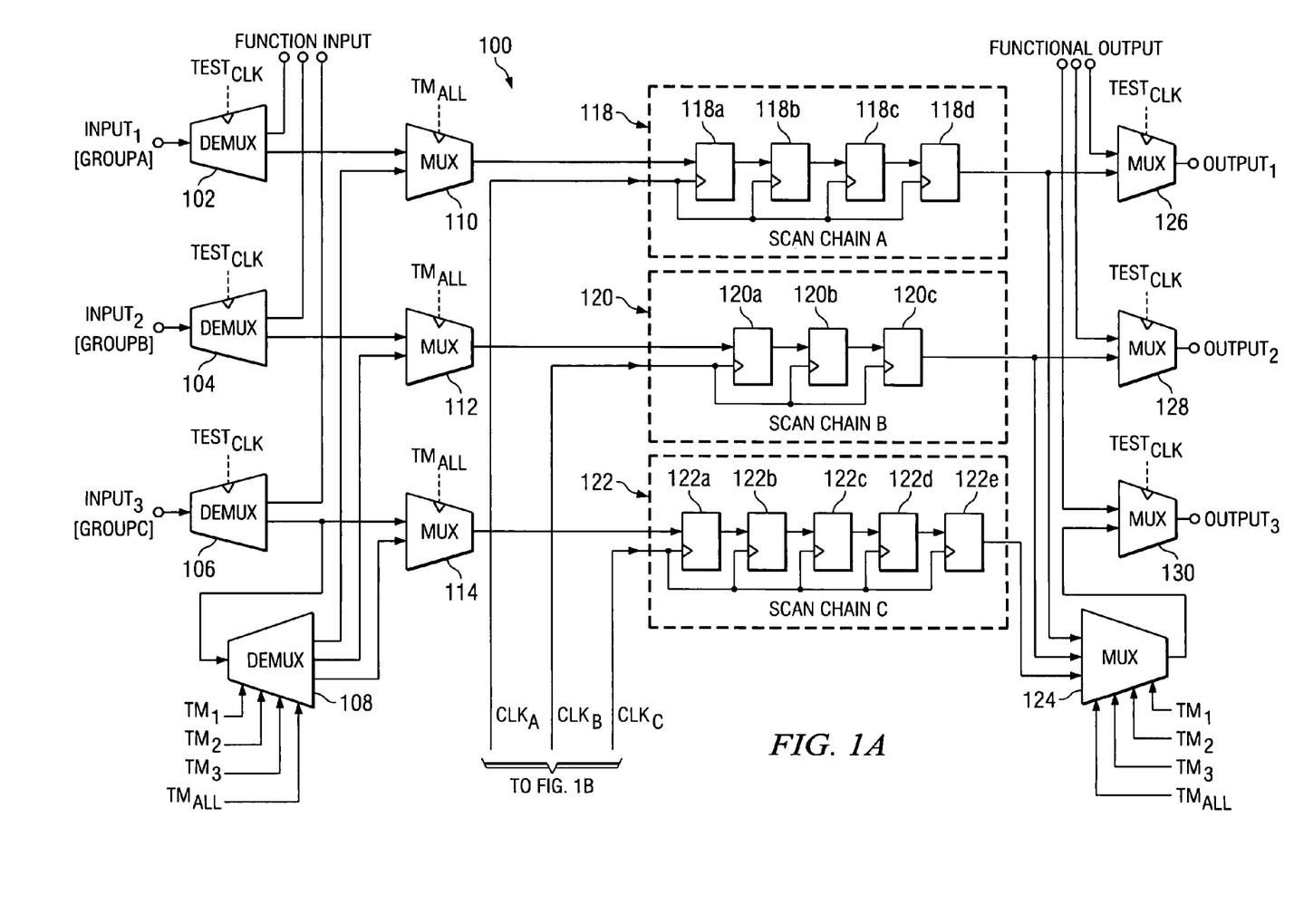
FIGS. 1A and 1B illustrate the scan testing circuit design for a SoC in accordance with the present invention.
Figure 1B:
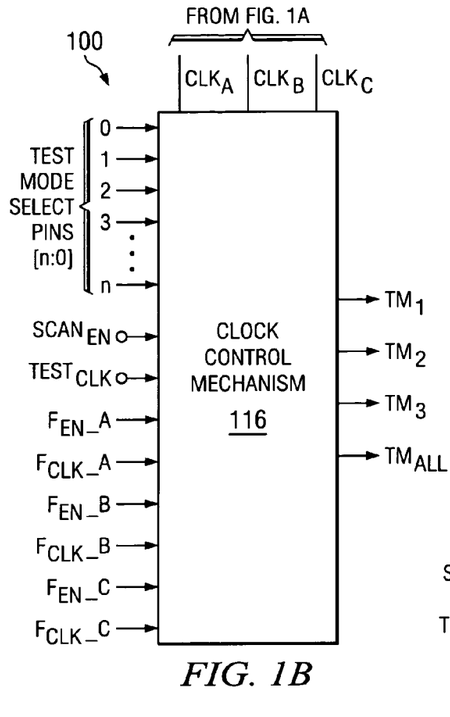

The present invention has been implemented on a Texas Instruments™ mixed signal SoC, Sangam™ (TNETD7300), which is a SoC that includes a MIPS processor and an asynchronous digital subscriber line (ADSL) physical layer (PHY) subsystem together with peripherals designed to serve as a single chip ADSL bridge or router device for residential and small office applications. Given the at-speed scan design in accordance with the present invention and its implementation on an ADSL CPE modem having analog and digital modules, there may be, for example, seven clock domains, varying from 10 to 200 MHz. Sangam™ has 29 scan chains derived from restrictions with other IP cores, clock domains, clock frequencies, functional partitioning, and scan chain balancing requirements. For the VLCT platform, the scan groups include:

Group A: 0–7 scan chains
Group B: 7–15 scan chains
Group C: 16–23 scan chains
Group D: 24–28 scan chains FIG. 1A illustrates the scan test circuit design for a mixed signal SoC in accordance with the present invention. For simplicity, FIG. 1A clearly shows three of the four groups, A, B, C, and D. The three scan chain groups, A, B, and C, as illustrated, couple between respective scan input and output terminals. Specifically, scan chain group A couples between input terminal $Input_1$ and output terminal $Output_1$. Scan chain B couples between input terminal $Input_2$ and output terminal $Output_2$ and scan chain C couples between input terminal $Input_3$ and output terminal $Output_3$. Each scan chain group A, B, and C include a demultiplexer unit, a first multiplexer unit, a scan chain, and a second multiplexer unit. Scan chain group A, in particular, includes demultiplexer unit 102, first multiplexer unit 110, scan chain 118 and second multiplexer unit 126. Demultiplexer unit 102 couples to receive test stimulus through input terminal $Input_1$. It demultiplexes the test stimulus to provide function inputs and the test stimulus along with the first multiplexer unit 110. A testing clock signal TEST provides the clocking for demultiplexer unit 102. A controlling demultiplexer 108 also couples to first multiplexer unit 110 to provide the appropriate control for testing scan chain group A. Controlling demultiplexer 108 couples to demultiplexer 106 and couples to receive signals $TM_1$, $TM_2$, $TM_3$, and $TM_{ALL}$. $TM_1$ represents a shift scan instruction to shift all Group A scan chains. Accordingly, $TM_2$ represents a shift scan instruction to shift all Group B scan chains and $TM_3$ represents a shift scan instruction to shift all Group C scan chains. $TM_{ALL}$ represents that a capture scan instruction is issued to capture on all scan chain groups. First multiplexer unit 110 provides a multiplexed signal to scan chain 118, wherein the scan chain is comprised of at least one flip-flop controlled by a clock control mechanism 116, as shown in FIG. 1B. Clock control mechanism 116 couples to receive test mode select pins [n:0], a scan enable signal $SCAN_{EN}$, a test clock signal $TEST_{CLK}$ and the functional enable and clocking signals, $F_{EN\_A}$, $F_{EN\_B}$, $F_{EN\_C}$, $F_{CLK\_A}$, $F_{CLK\_B}$, $F_{CLK\_C}$, for each of the scan chain groups, A, B, and C, respectively. The clock control mechanism 116 derives a control signal $CLK_A$, $CLK_B$, and $CLK_C$ for each scan chain group A, B, and C, respectively to concurrently clock in the test stimulus input data into each scan chain at its predetermined frequency. A controlling multiplexer 124 couples to receive the output of scan chain 118. Multiplexer 124 is used when a scan is performed on VLCT. The multiplexer routes the scan output of groups A, B, or C according to the respective test mode $TM_1$, $TM_1$, or $TM_2$. In a non-VLCT mode, where all the scan groups can be exercised in parallel, the respective output multiplexers are used. In addition, scan chain 118 connects to second multiplexer 126 to provide the resultant data. The functional output represents resultant data when the SoC has performed correctly given the same test stimulus. This functional output is transmitted to the second multiplexer 126. Accordingly, the second multiplexer 126 provides a multiplexed output between the two results as input for determining whether there is an error or not. As stipulated earlier scan chain group B, and C include respective demultiplexer units, 104 and 106, first multiplexer units, 112 and 114, scan chains, 120 and 122, and second multiplexer units, 128 and 130. Scan chain groups B and C have similar arrangements to that of scan chain group A. Notably, there may be more than three scan chain groups.

These three scan chains, A, B, and C, are grouped such that all scan chains being clocked by the same clock are included in the same group. There are no two scan chains in one group having different clocks. Multiple scan chain groups are created such that each group has not more than eight scan chains within a given group. During the operation of one scan chain group, the other scan chain groups are disabled. This is mandatory during scan shift. Additionally, conditional capture into the last shifted domain is also supported. Advantageously, during scan capture, however, the capture clock can be applied to more than one scan chain group simultaneously. Thus, there is selectability during the scan capture. As such, five VLCT test modes are provided, i.e. VLCT-Shift-A, VLCT-Shift-B, VLCT-Shift-C, VLCT-Shift-D and Capture-All.

As shown, the scan test circuit design in accordance with the present invention requires the control of the scan shift and scan capture clocks across multiple scan groups. Conventional solutions that include a large number of scan chains preclude the use of VLCT or the support for at-speed ATPG pattern application using high speed capture clocks. In the alternative, having a larger number of scan chains requires sophisticated masking among the flip-flops in one or more scan chains. The BIST circuit design in accordance with the present invention solves these problems; thereby, providing true at-speed testing over the entire device, across all clock domains and clock frequencies. In addition, this BIST circuit design is scaleable. Those of skill in the art will recognize that the number of scan chain groups may be expanded to a larger number greater than three groups and physical location of the elements illustrated in FIG. 1 can be moved or relocated while retaining the function described above. For example, as in the Sangam ADSL modem, four or more scan chain groups may exist.

Each scan chain group, A, B, and C, has a respective clock domain in which a respective shift group signal, $TM_1$, $TM_2$, and $TM_3$, is derived. The test stimulus is shifted through each scan chain group at the rate of a shift clock rate, $CLK_A$, $CLK_B$ and $CLK_C$, is derived from each clock domain. These three shift group signals, $TM_1$, $TM_2$, and $TM_3$, along with a shift group signal $TM_{ALL}$, wherein all scan chain groups are shifted, are used accordingly. A test mode signal enables the testing of each of the scan chain groups, A, B, and C, to apply the test stimulus to the functional portion of the SoC. This test mode along with the scan and clock control mechanism 116 are provided to switch between the multiple scan chain groups, A, B, and C, in an order determined by the test mode selection. As a result, it is also possible to generate ATPG patterns for any combination of the scan chain groups whereby the pattern volume is reduced substantially.

In operation, test stimulus input data is applied at the input terminals, $Input_1$, $Input_2$, and $Input_3$, of the various scan chain groups. The demultiplexer unit, 102, 104, and 106, of each scan chain demultiplexes the input data such that the function inputs for the parts of the SoC to be tested are separated from the part of the signal that will be applied to the remainder of the scan chain group. This signal is received by each respective first multiplexer unit, 110, 112, and 114, where the shift all signal $TM_{ALL}$ is used as a select signal for the each respective first multiplexer unit, 110, 112, and 114. A controlling demultiplexer 108 couples to receive all the shift group signal, $TM_1$, $TM_2$, $TM_3$, and $TM_{ALL}$ in addition to the output from the last scan chain group's demultiplexer 106 output. The controlling demultiplexer 108 provides the second input for each respective first multiplexer unit, 110, 112, and 114, wherein the signal generated by the controlling demultiplexer 108 is multiplexed with the demultiplexed test stimulus data. This multiplexed output from the first multiplexer units, 110, 112, and 114, are connected to each respective scan chain. The clock control mechanism 116 provides the clocking signals, $CLK_A$, $CLK_B$ and $CLK_C$, for each respective scan chain, 118, 120, and 122. Thus, the test stimulus data is clocked through the respective scan chains at the clocking rate provided by the respective clocking signals $CLK_A$, $CLK_B$ and $CLK_C$. The controlling multiplexer 124 couples to receive the output from each scan chain, 118, 120, and 122, to provide a control/enable signal for second multiplexer unit 130. The controlling multiplexer 124 addresses different test modes. It enables each scan chain group to be shifted serially one after the other and enables simultaneous capture. The function outputs from the functional portion of the SoC being tested are received by second multiplexer units, 126, 128 and 130. As a result, the controlling multiplexer 124 will mask those scan chain groups that do not correspond with the specified test mode (i.e. during test mode $TM_1$, scan chain groups B and C will be masked during capture). The multiplexed outputs of the second multiplexer units, 126, 128 and 130 are provided as outputs having the resultant testing results of the test stimulus applied to the functional portion of the SoC. During a capture, two clock pulses separated by a time equal to the clock frequency of the clock period of the clock domain corresponding to the scan chain group being captured.

During the full device scan ATPG mode, scan patterns are shifted into all the scan chains (e.g. 29 scan chains for Sangam™). For stuck-at fault testing at lower frequency, capture is conducted on one or more domain scan chain groups at a time, while the scan outputs of other scan chain groups may be correspondingly masked. For at-speed testing, however, capture is conducted on one domain/scan chain group at a time, while the scan outputs of other scan chain groups are masked. During a full device scan using the VLCT platform, scan patterns are shifted into the scan chains, one group after another. When patterns are loading into one scan group the other groups are held static by disabling the clocks. After all the scan chains are initialized, capture is conducted on all the scan groups and the scan outputs from the specific group are multiplexed out. The scan group selection is conducted by asserting the appropriate code on the test mode select pins [n:0]. The test mode decode logic within the clock control mechanism 116 gates the clock inputs to different domains.

Specifically, stuck-at fault testing during the full device scan using the VLCT platform includes a first step of asserting the test mode. The appropriate code is applied on the test mode select pins [n:0]. Scan patterns are shifted into all the scan chains at a low frequency using a tester clock. At the end of the shift, a capture clock is issued from the tester and the scan outputs are shifted out. At-speed transition fault testing during the full device scan using the VLCT platform, the first step includes asserting the test mode. Secondly, the appropriate code is applied on the test mode select pins [n:0]. Scan patterns are shifted into all the scan chains one after another in a third step. When the patterns are loading into one scan chain group the other groups are held static by disabling their clocks. After all the scan chains are initialized, two capture pulses are applied and issued from the tester at the frequency of operation of the clock domain of the scan chains. Accordingly, the scan outputs are shifted out, while the scan outputs of the other groups are masked. This sequence is repeated for at-speed capture for each of the frequency domains.

Optimum testing may be implemented given proper clock selection and balancing, appropriate test pin multiplexing, and proper scan chain control. This scan test design supports slow speed scan shifts as well as rated speed scan captures into the multiple scan chain groups. Moreover, this grouping of scan chains covers all inter-clock domain paths, such that the capture data is valid for the scan chain group receiving the at-speed clock, (and other faster groups), and will be invalid for the scan chain groups running off slower clocks. A scan test design in accordance with the present invention works equally well for both scan justified, (launch off shift) as well as functionally justified, launch off capture, at speed ATPG patterns, as well as for stuck-at ATPG patterns.

Figure 2:
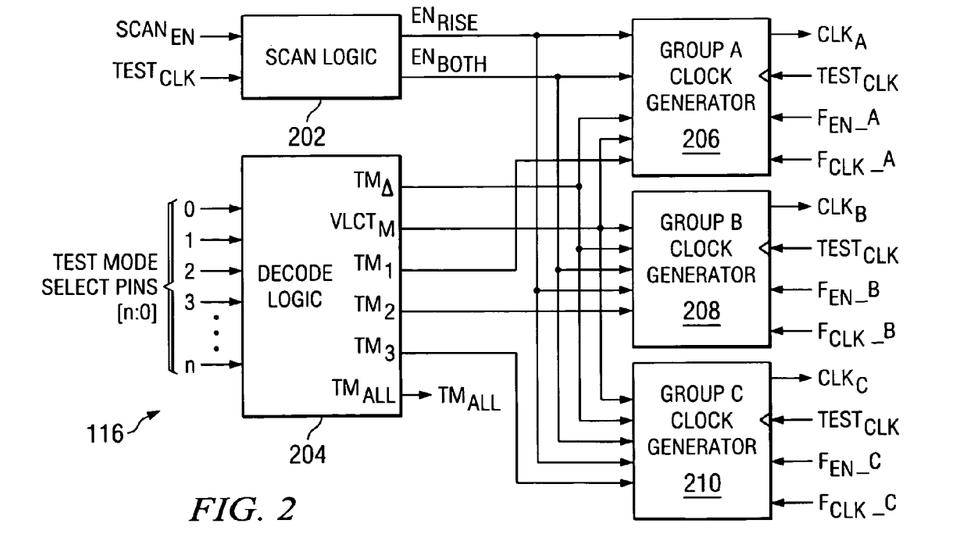
FIG. 2 displays the clock control mechanism implemented in the scan testing circuit design of FIG. 1.

FIG. 2 represents the logic design of clock control mechanism 116 which includes scan logic 202, decode logic 204 and the clock generators, 206, 208 and 210, for scan chain groups A, B, and C. The scan logic 202 couples to receive the scan enable $SCAN_{EN}$ and test clock $TEST_{CLK}$ signals to generate enable signals, $EN_{RISE}$ and $EN_{BOTH}$, for clock generators, 206, 208 and 210. Decode logic 204 decodes the input test mode select pins [n:0] to provide the test mode delta signal $TM\Delta$, the VLCT mode signal $VLCT_M$, the first test mode signal $TM_1$ for scan chain group A, the second test mode signal $TM_2$ for scan chain group B, the third test mode signal $TM_3$ for scan chain group C, and the fourth test mode signal $TM_{ALL}$ for simultaneous testing of all scan chain groups.

The clock generator 206 for group A couples to receive the enable signals, $EN_{RISE}$ and $EN_{BOTH}$, the test mode delta signal $TM\Delta$, the VLCT mode signal $VLCT_M$, the first test mode signal $TM_1$, the test clock $TEST_{CLK}$, the functional enable signal $F_{EN}\_A$ and functional clock signal $F_{CLK}\_A$ to generate the clock signal $CLK_A$ for scan chain group A.

The clock generator 208 for group B couples to receive the enable signals, $EN_{RISE}$ and $EN_{BOTH}$, the test mode delta signal $TM\Delta$, the VLCT mode signal $VLCT_M$, the first test mode signal $TM_2$, the test clock $TEST_{CLK}$, the functional enable signal $F_{EN}\_B$ and functional clock signal $F_{CLK}\_B$ to generate the clock signal $CLK_B$ for scan chain group B.

The clock generator 210 for group C couples to receive the enable signals, $EN_{RISE}$ and $EN_{BOTH}$, the test mode delta signal $TM\Delta$, the VLCT mode signal $VLCT_M$, the first test mode signal $TM_3$, the test clock $TEST_{CLK}$, the functional enable signal $F_{EN}\_C$ and functional clock signal $F_{CLK}\_C$ to generate the clock signal $CLK_C$ for scan chain group C.

Figure 3:
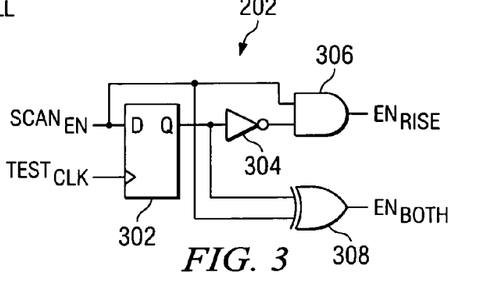
FIG. 3 shows the scan enable registering logic of F*ig*. 1.

FIG. 3 illustrates the schematic for scan logic 202 of FIG. 2 which generates enable signals, $EN_{RISE}$ and $EN_{BOTH}$. As shown, DQ flip-flop 302 receives the scan enable signal $SCAN_{EN}$ and the test clock signal $TEST_{CLK}$. The output of flip-flop 302 is inverted by inverter 304 to provide input for AND gate 306. AND gate 306 also couples to receive the scan enable signal $SCAN_{EN}$ to provide at its output the enable signal $EN_{RISE}$. Enable signal $EN_{RISE}$ detects a rising edge on the scan enable (chip input), scan enable signal $SCAN_{EN}$. XOR gate 308 couples to receive the scan enable signal $SCAN_{EN}$ and the output of flip-flop 302 to provide at its output the enable signal $EN_{BOTH}$. Enable signal $EN_{BOTH}$ detects a rising or falling transition on scan enable input. These two signals, $EN_{RISE}$ and $EN_{BOTH}$, are used for gating off the clock pulse whenever there is a transition on scan enable $SCAN_{EN}$. For scan testing on a high end tester, the clock pulse must be gated off whenever a capture has been performed and a shift is to follow. For example, in the case when the scan enable transitions from "0" to "1". This is necessary as one clock pulse is needed for the transition on the scan enable input $SCAN_{EN}$ to be registered internally. For scan testing on the VLCT platform, in addition to above clock gating, the clock pulse must also be gated off when the test mode changes, i.e., when the test mode select pins are changed to shift a different scan group.

Figure 4:
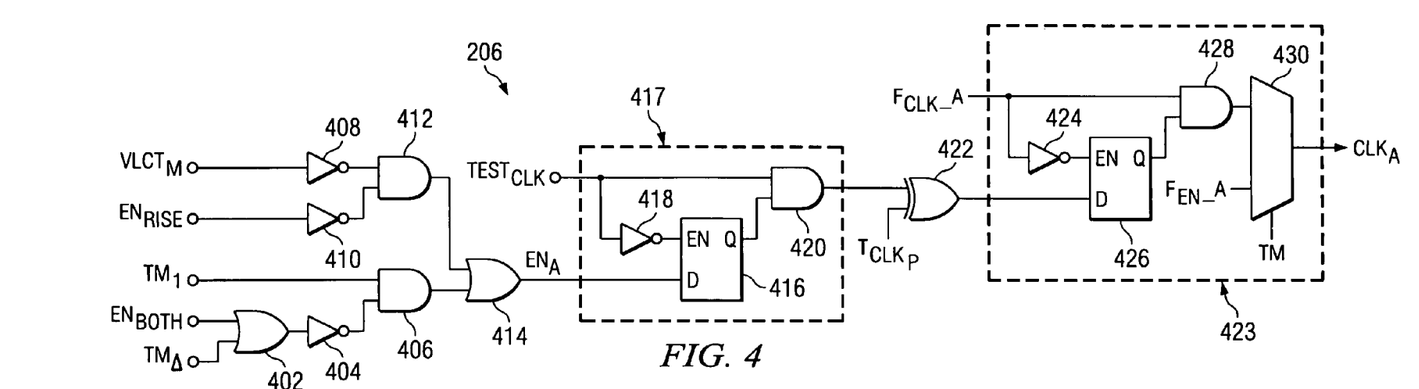
FIG. 4 illustrates the clock generator for scan chain group A of FIG. 1.

FIG. 4 shows how the signals are used to gate the clock for the scan chain group A. Although this figure illustrates Group A alone, FIGS. 5 and 6 demonstrate that the gating for the other groups, B and C, and are identical. More particularly, FIG. 4 illustrates the clock generator 206 for scan chain group A of FIG. 2. Inverters, 408 and 410, couple to receive the VLCT mode signal $VLCT_M$ and the enable signal $EN_{RISE}$, respectively. The signal $VLCT_M$ is a decoded output of the test mode select inputs and indicates a VLCT test mode. AND gate 412 connects to inverters, 408 and 410 and provides input to OR gate 414. OR gate 402 couples to receive the enable signal $EN_{BOTH}$ and the test mode delta signal TMΔ. Inverter 404 inverts the output of OR gate 402 to be provided as input to AND gate 406. AND gate 406 connects to receive the first test mode signal $TM_1$. First test mode signal $TM_1$ is again a decoded output of the test mode select inputs [n:0] that indicates that scan chain group A is being shifted. OR gate 414 connects to AND gates, 406 and 412 to generate group A enable signal $EN_A$. When the VLCT mode signal $VLCT_M$ is "0," the scan test circuitry is in a non-VLCT test mode. The enable signal $EN_{RISE}$ is used for clock gating. When this signal is high, the scan test circuitry is in a VLCT mode. Both the enable signal ENBOTH and the test mode delta signal TMΔ are used to gate off the clock pulse. The enable signal $EN_A$ is generated and used to gate the clocks through clock-gating macros, 417 and 423, as shown. DQ flip-flop 416 couples to receive enable signal $EN_A$ at its D input. Inverter 418 inverts the test clock signal $TEST_{CLK}$ for the enable input of flip-flop 416. AND gate 420 connects to the output of flip-flop 416 and receives the test clock signal $TEST_{CLK}$. XOR gate 422 couples to AND gate 420 and receive a polarity clock signal $TCLK_P$. Polarity clock signal $TCLK_P$ provides additional gating. It comes from a programmable test register that is used to invert the clock if required. The D input of DQ flip-flop 426 connects to the output of XOR gate 422. Inverter 424 inverts the functional clock $F_{CLK\_A}$ for the enable input of flip-flop 426. AND gate 428 connects to the output of flip-flop 426 and receives the functional clock $F_{CLK\_A}$. Finally, the test clock is multiplexed with the functional enable signal $F_{EN\_A}$ using clock gating macro 423. As shown, multiplexer 430 connects to AND gate 428 and receives the functional enable signal $F_{EN\_A}$ to generate clock signal $CLK_A$, wherein test mode signal TM provides the control for multiplexer 430.

Figure 5:
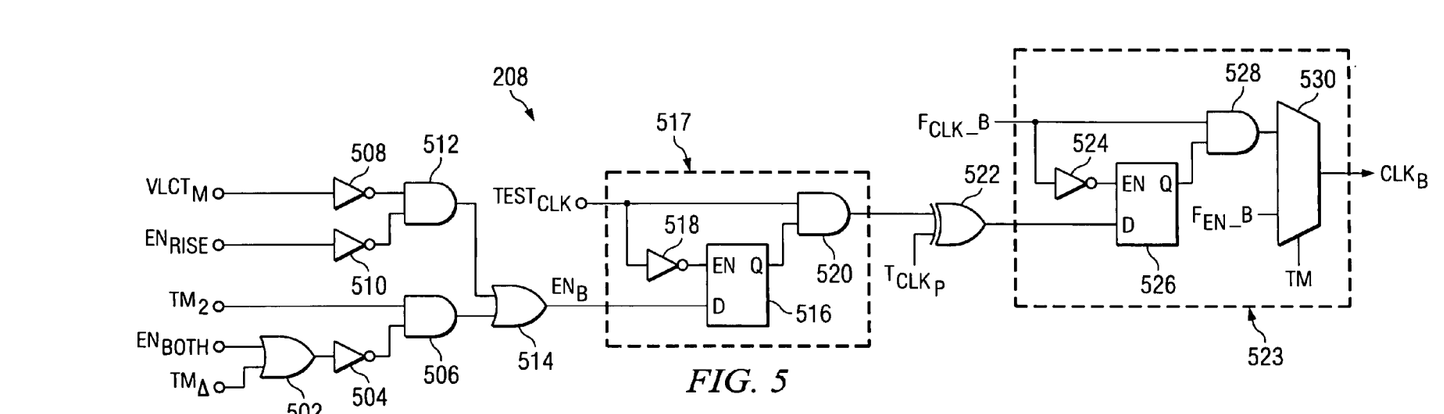
FIG. 5 shows the clock generator for scan chain group B of FIG. 1.

FIG. 5 illustrates the clock generator 208 for scan chain group B of FIG. 2. Inverters, 508 and 510, couple to receive the VLCT mode signal $VLCT_M$ and the enable signal $EN_{RISE}$, respectively. AND gate 512 connects to inverters, 508 and 510 and provides input to OR gate 514. OR gate 502 couples to receive the enable signal $EN_{BOTH}$ and the test mode delta signal TMΔA. Inverter 504 inverts the output of OR gate 502 to be provided as input to AND gate 506. AND gate 506 connects to receive the second test mode signal $TM_2$. OR gate 514 connects to AND gates, 506 and 512 to generate group B enable signal $EN_B$. DQ flip-flop 516 couples to receive enable signal $EN_B$ at its D input. Inverter 518 inverts the test clock signal $TEST_{CLK}$ for the enable input of flip-flop 516. AND gate 520 connects to the output of flip-flop 516 and receives the test clock signal $TEST_{CLK}$. XOR gate 522 couples to AND gate 520 and receive a polarity clock signal $TCLK_P$. The D input of DQ flip-flop 526 connects to the output of XOR gate 522. Inverter 524 inverts the functional clock $F_{CLK\_B}$ for the enable input of flip-flop 526. AND gate 528 connects to the output of flip-flop 526 and receives the functional clock $F_{CLK\_B}$. Multiplexer 530 connects to AND gate 528 and receives the functional enable signal $F_{EN\_B}$ to generate clock signal $CLK_B$. Test mode signal TM provides the control for multiplexer 530.

Figure 6:
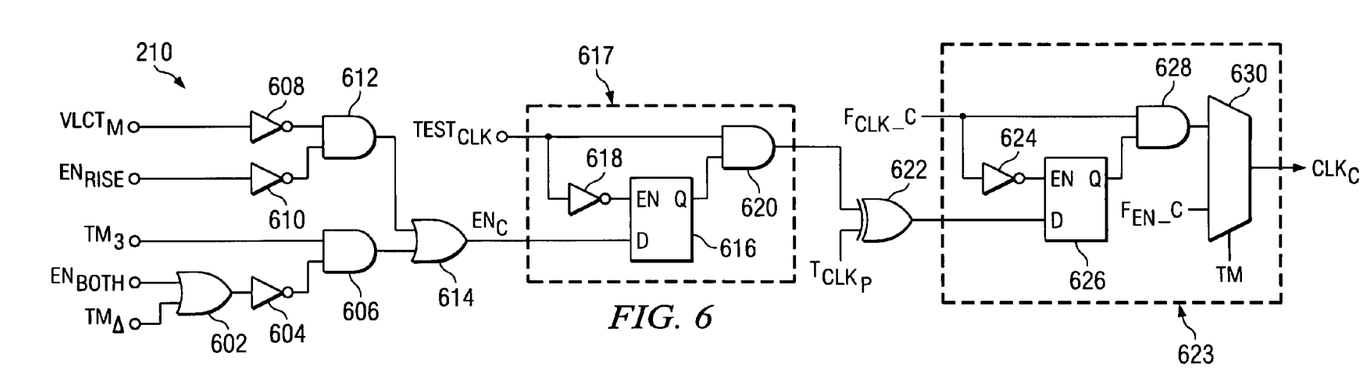
FIG. 6 displays the clock generator for scan chain group C of FIG. 1.

FIG. 6 illustrates the clock generator 210 for scan chain group C of FIG. 2. Inverters, 608 and 610, couple to receive the VLCT mode signal $VLCT_M$ and the enable signal $EN_{RISE}$, respectively. AND gate 612 connects to inverters, 608 and 610 and provides input to OR gate 614. OR gate 602 couples to receive the enable signal $EN_{BOTH}$ and the test mode delta signal TMΔ. Inverter 604 inverts the output of OR gate 602 to be provided as input to AND gate 606. AND gate 606 connects to receive the third test mode signal $TM_3$. OR gate 614 connects to AND gates, 606 and 612 to generate group C enable signal $EN_C$. DQ flip-flop 616 couples to receive enable signal $EN_C$ at its D input. Inverter 618 inverts the test clock signal $TEST_{CLK}$ for the enable input of flip-flop 616. AND gate 620 connects to the output of flip-flop 616 and receives the test clock signal $TEST_{CLK}$. XOR gate 622 couples to AND gate 620 and receive a polarity clock signal $TCLK_P$. The D input of DQ flip-flop 626 connects to the output of XOR gate 622. Inverter 624 inverts the functional clock $F_{CLK\_C}$ for the enable input of flip-flop 626. AND gate 628 connects to the output of flip-flop 626 and receives the functional clock $F_{CLK\_C}$. Multiplexer 630 connects to AND gate 628 and receives the functional enable signal $F_{EN\_C}$ to generate clock signal $CLK_C$. Test mode signal TM provides the control for multiplexer 630.

Figure 7:
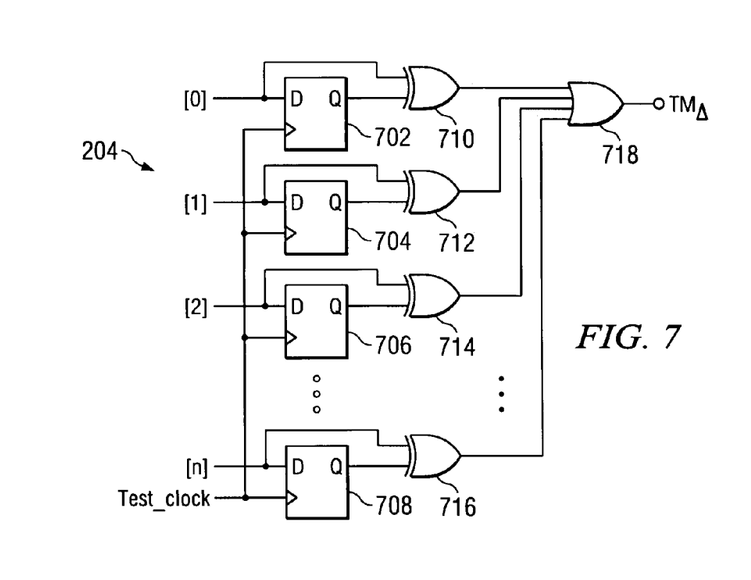
FIG. 7 illustrates the test mode select arrangement for the test mode delta signal TMΔ of FIG. 2.
Figure 8:
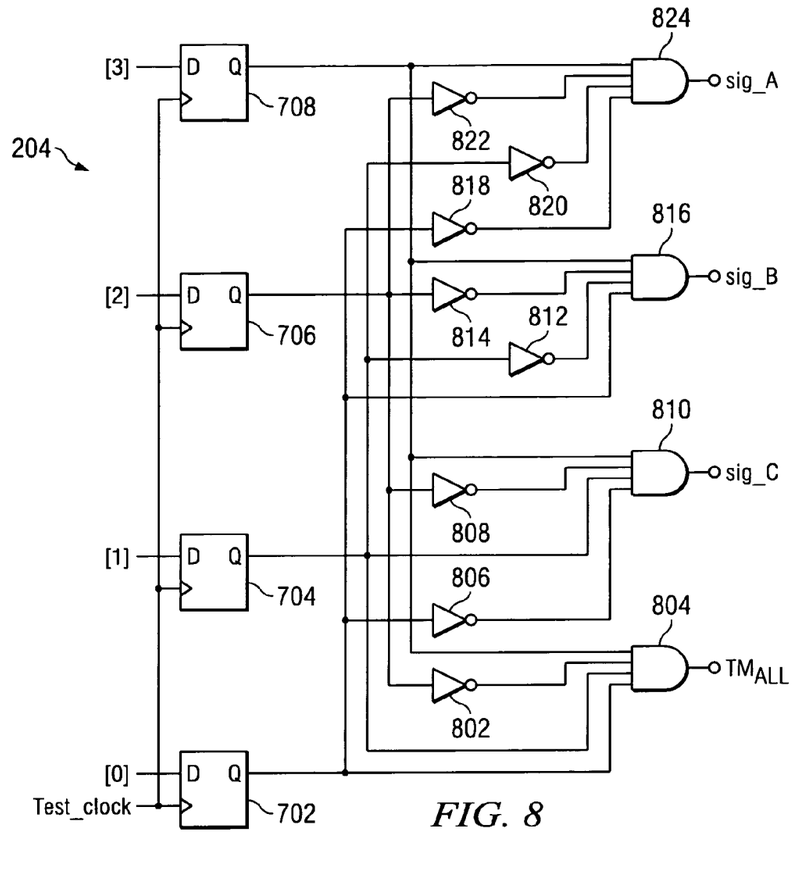
FIG. 8 illustrates the test mode select arrangement for the simultaneous test mode signal $TM_{ALL}$ and intermediate control signals, sig_A, sig_B, and sig_C.
Figure 9:
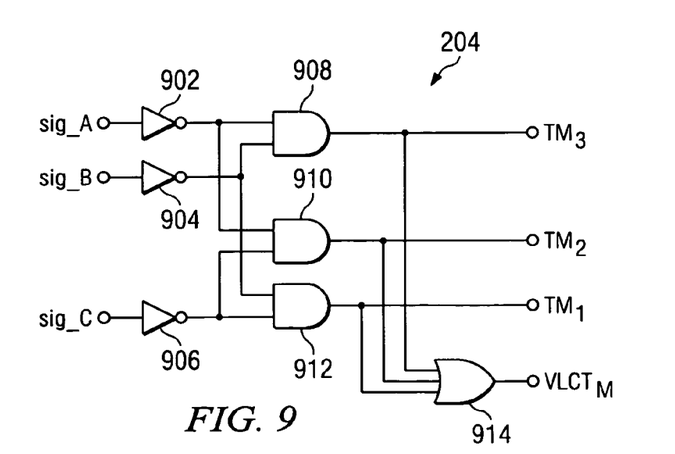
FIG. 9 displays the test mode select arrangement for the first, second and third test mode signals, $TM_1$, $TM_2$, and $TM_3$, and the VLCT mode signal $VLCT_M$ of FIG. 2.

FIGS. 7, 8 and 9 display the test mode select signal decode logic 204 of FIG. 2. FIG. 7 shows the generation of the test mode delta signal TMΔ which indicates when the test mode has changed. This signal indicates to the clock gating logic of FIGS. 4, 5, and 6 that a different group is now being shifted. Specifically, FIG. 7 includes flip-flops, 702, 704, 706 and 708, coupled to receive the signals from the test mode select pins [n:0] and the test clocking signal $TEST_{CLK}$. XOR gates, 710, 712, 714, and 716, couple respectively to the D inputs and outputs of flip-flops, 702, 704, 706 and 708, respectively. OR gate 718 connects to the outputs of XOR gates, 710, 712, 714, and 716 to generate the test mode delta signal TMΔ.

In FIG. 8, the outputs of flip-flops, 702, 704, 706 and 708, to each of the AND gates 804, 810, 816, and 824, wherein intervening inverters 802, 806, 808, 812, 814, 818, 820 and 822 provide the appropriate pattern generation to generate signals sig_A, sig_B, sig_C and $TM_{ALL}$. As is shown in FIG. 8 the following table provides the results according to the test mode select pins [3:0]:

| Time Select Pins [3:0] | sig_A | sig_B | sig_C | $TM_{ALL}$ |
|---|---|---|---|---|
| 1000 | 1 | 0 | 0 | 0 |
| 1001 | 0 | 1 | 0 | 0 |
| 1010 | 0 | 0 | 1 | 0 |
| 1011 | 0 | 0 | 0 | 1 |

FIG. 9 shows the final generation of test mode signals $TM_1$, $TM_2$, $TM_3$, and $VLCT_M$. In particular, signals sig_A, sig_B, sig_C are received by inverters 902, 904, and 906, respectively. AND gate 908 connects to inverters, 902 and 904, to generate test mode signal $TM_3$. AND gate 910 connects to inverters, 902 and 906, to generate test mode signal $TM_2$. AND gate 912 connects to inverters, 904 and 906, to generate test mode signal $TM_1$. OR gate 914 couples to the outputs of AND gates 908, 910, 912 to generate the VLCT mode signal $VLCT_M$.

In the alternative, a second embodiment may include more than three scan chain groups. As stated earlier, those of skill in the art will recognize that the number of scan groups may be expanded to a larger number greater than three groups and physical location of the elements illustrated in FIG. 1 can be moved or relocated while retaining the function described above. For example, as in the Sangam ADSL modem, four or more scan chain groups may exist.

Advantages of this design include but are not limited to a scan test circuitry having a high performance, simple, and cost effective design.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A scan test circuit design imbedded within an integrated circuit chip having a test clock signal, comprising:
    at least one scan-in terminal coupled to receive a test stimulus input data;
    at least one scan-out terminal to output testing resultant data;
    at least one scan chain group each having a clock domain, the at least one scan chain group coupled between one of the at least one scan-in terminal and one of the at least one scan-out terminal, wherein the test clock signal enables the testing of each of the at least one scan chain group, each scan chain group has a corresponding test mode signal to shift the test stimulus input data at a shift clock rate derived from the corresponding clock domain, wherein each at least one scan chain group comprises,
    a demultiplexer unit, having an input, an enable input, a first output and a second output, the input coupled to receive the test stimulus input data, the enable input coupled to receive the test clock signal, the first output coupled to a functional input for the portion of the integrated circuit chip being tested,
    a first multiplexer unit, having a first input, a second input, an enable input, and an output, the first input coupled to the second output of the demultiplexer unit, the enable input coupled to receive a simultaneous test mode signal,
    a scan chain, having an input, a control input, and an output, the input coupled to the output of the first multiplexer unit, the scan chain having a corresponding scan chain clock domain at a predetermined frequency, and
    a second multiplexer unit, having a first input, a second input, an enable input, and an output, the first input coupled to the output of the scan chain, the second input coupled to receive functional output data from the portion of the integrated circuit chip being tested to supply testing resultant data at the output;
    a controlling demultiplexer coupled to the second output of one demultiplexer unit and coupled to receive the simultaneous test mode signal and a plurality of test mode signals for each scan chain group to generate control signals to be coupled to the second input of each first multiplexer unit to control the concurrent shifting of the test stimulus input data into each scan chain at the predetermined frequency;
    a clock control mechanism coupled to receive the test clock signal, a plurality of test mode select pin inputs, a scan enable signal, functional clock and function enable signals corresponding to each of the at least one scan chain groups to generate the control input signal for each scan chain, the plurality of test mode signals for each scan chain group and the simultaneous test mode signal,
    wherein the clock control mechanism coupled to the control input of each scan chain of the at least one scan chain group to enable one scan chain to shift test stimulus input data when the scan enable signal is enabled and the test clock signal is enabled, the clock control mechanism coupled to each scan chain to enable simultaneous capture of each of the at least one scan chain group when the scan enable, the test clock, and the simultaneous test mode signal are enabled; and
    a controlling multiplexer coupled to the output of each scan chain and coupled to receive each test mode signal to generate a control signal for the second multiplexer of the least significant of the at least one scan chain group.

2. An integrated circuit chip as recited in claim 1, wherein the clock control mechanism comprises:
    a scan logic device coupled to receive the test clock signal and a scan enable signal to generate an enable signal that detects the rising edge on the scan enable signal and an enable signal that detects a rising or falling transition on the scan enable signal;
    at least one clock generator for a respective one of the at least one scan chain groups coupled to receive both enable signals generated by the scan logic device, the test clock signal, the function enable and clock signals corresponding to the at least one scan chain group to produce a clock signal for controlling the scan chain of the respective at least one scan chain group; and a decode logic unit, having the test mode select pins, the decode logic unit coupled to each one of the at least one clock generators to provide a test mode delta signal, a VLCT mode signal, the test mode signals corresponding to each respective one of the at least one scan chain groups, and the simultaneous test mode signal for simultaneous testing of all scan chain groups.

3. An integrated circuit chip as recited in claim 2, wherein the scan logic device comprises:

a DQ flip-flop, having a clock input, a D-input and a Q-output, the clock input coupled to receive the test clock signal, the D-input coupled to receive the scan enable signal;

an inverter coupled to the Q-output;

an AND gate, having a first input, a second input, and an output, to generate at the output the enable signal that detects the rising edge on the scan enable signal, the first input coupled to receive the scan enable signal, the second input coupled to the inverter; and an XOR gate, having a first input, a second input and an output, to generate at the output the enable signal that detects a rising or falling transition on the scan enable signal, the first input coupled to the Q-output, the second input coupled to receive the scan enable signal.

4. An integrated circuit chip as recited in claim 2, wherein the clock generator comprises:

a first inverter coupled to receive the VLCT mode signal;

a second inverter coupled to receive the enable signal that detects the rising edge on the scan enable signal;

a first AND gate coupled to the first inverter and the second inverter;

a first OR gate coupled to receive the enable signal that detects a rising or falling transition on the scan enable signal and the test mode delta signal;

a third inverter coupled to the first OR gate;

a second AND gate coupled to the third inverter and coupled to receive one of the test mode signals corresponding to each respective one of the at least one scan chain groups;

a second OR gate coupled to the first and second AND gates;

a first DQ flip-flop, having a D-input, an enable input and a Q-output, the D-input coupled to the second OR gate;

a fourth inverter, having an input and an output, the input coupled to receive the test clock signal, the output coupled to enable input of the first DQ flip-flop;

a third AND gate coupled to the Q-output of the first DQ flip-flop and coupled to receive the test clock signal;

an XOR gate coupled to the third AND gate and coupled to receive a polarity test clock signal;

a second DQ flip-flop, having a D-input, an enable input and a Q-output, the D-input coupled to the XOR gate;

a fourth inverter, having an input and an output, the input coupled to receive the functional clock signal corresponding to the at least one scan chain group, the output coupled to enable input of the second DQ flip-flop;

a fourth AND gate coupled to the Q-output of the second DQ flip-flop and coupled to receive the functional clock signal corresponding to the at least one scan chain group; and a multiplexer unit, having a first input, a second input, a control input and an output, to provide the clock signal for controlling the scan chain of the respective at least one scan chain group, the first input coupled to the fourth AND gate, the second input coupled to receive the functional enable signal corresponding to the at least one scan chain group, the control input coupled to a test mode signal.

5. An integrated circuit chip as recited in claim 2, wherein the decode logic unit comprises:

a plurality of DQ flip-flops, each having a D-input, a Q-output, an inverted Q-output, and a clock input, each clock input coupled to receive the test clock signal, each D-input coupled to a respective test mode select pin;

a plurality of XOR gates, each having a first input, a second input and an output, each first input coupled to a respective test mode select pin, each second input coupled to a respective Q-output of the plurality of DQ flip-flops; and a OR gate coupled to the output of each of the plurality of XOR gates to generate the test mode delta signals;

a plurality of multi-input AND gates, each having a number of inputs corresponding to the number of DQ flip-flops and an output, each input coupled to a Q-output or an inverted Q-output in a specified pattern to generate intermediate signals for each test mode corresponding to the at least one scan chain group and to generate the simultaneous test mode signal for simultaneous testing of all scan chain groups;

a first inverter coupled to receive the first intermediate signal for a respective test mode corresponding to the at least one scan chain group;

a second inverter coupled to receive the second intermediate signal for a respective test mode corresponding to the at least one scan chain group;

a third inverter coupled to receive the third intermediate signal for a respective test mode corresponding to the at least one scan chain group a first AND gate coupled to the first and second inverter to provide the test mode signal corresponding to the third scan chain group;

a second AND gate coupled to the first and third inverter to provide the test mode signal corresponding to the second scan chain group;

a third AND gate coupled to the second and third inverter to provide the test mode signal corresponding to the second scan chain group;

a OR gate coupled to the first, second and third AND gates to generate the VLCT mode signal.

* * * * *